(12) United States Patent
Takii

(10) Patent No.: US 10,056,436 B2
(45) Date of Patent: Aug. 21, 2018

(54) ORGANIC LIGHT EMITTING DISPLAY DEVICE COMPRISING COLOR FILTERS AND METHOD OF MANUFACTURING THE SAME

(71) Applicant: Samsung Display Co., Ltd., Yongin (KR)

(72) Inventor: Kenji Takii, Suwon-si (KR)

(73) Assignee: SAMSUNG DISPLAY CO., LTD., Yongin (KR)

(*) Notice: Subject to any disclaimer, the term of this patent is extended or adjusted under 35 U.S.C. 154(b) by 0 days.

(21) Appl. No.: 14/789,200

(22) Filed: Jul. 1, 2015

(65) Prior Publication Data

US 2016/0190212 A1    Jun. 30, 2016

(30) Foreign Application Priority Data

Dec. 26, 2014 (KR) .................. 10-2014-0190563

(51) Int. Cl.
*H01L 27/32* (2006.01)
*H01L 51/52* (2006.01)

(52) U.S. Cl.
CPC ........ *H01L 27/322* (2013.01); *H01L 51/5265* (2013.01)

(58) Field of Classification Search
CPC .................................................. H01L 27/322
See application file for complete search history.

(56) References Cited

U.S. PATENT DOCUMENTS

| | | | | |
|---|---|---|---|---|
| 5,948,577 A * | 9/1999 | Nakazawa | ............. | B41M 3/003 349/106 |
| 6,392,729 B1 * | 5/2002 | Izumi | ................ | G02F 1/133512 349/106 |
| 6,671,025 B1 * | 12/2003 | Ikeda | ................ | G02F 1/133514 349/106 |
| 2001/0026347 A1 * | 10/2001 | Sawasaki | .......... | G02F 1/133707 349/156 |
| 2004/0070039 A1 * | 4/2004 | Sekine | ............. | H01L 27/14621 257/428 |
| 2007/0291335 A1 * | 12/2007 | Lee | ......................... | G02B 5/201 358/512 |
| 2008/0165263 A1 * | 7/2008 | Hsu | ................... | H01L 27/14621 348/281 |
| 2009/0303359 A1 * | 12/2009 | Otsuka | ................... | G02B 5/201 348/280 |

(Continued)

FOREIGN PATENT DOCUMENTS

EP         2 485 567     8/2012
JP        2014-063086    4/2014

(Continued)

*Primary Examiner* — Marcos D Pizarro
*Assistant Examiner* — Christopher M Roland
(74) *Attorney, Agent, or Firm* — H.C. Park & Associates, PLC

(57) ABSTRACT

An organic light emitting display device includes a substrate, first electrodes disposed on the substrate; an organic light emitting layer formed on the first electrodes; a second electrode disposed on the organic light emitting layer; and a color filter layer formed on the second electrode. The color filter layer includes a first color filter, a second color filter, and a third color filter. The second color filter and the third color filter are disposed pixel blocks included in the first color filter.

15 Claims, 14 Drawing Sheets

(56) References Cited

U.S. PATENT DOCUMENTS

| | | | |
|---|---|---|---|
| 2010/0123137 A1* | 5/2010 | Yang | H01L 27/1214 |
| | | | 257/59 |
| 2012/0032583 A1* | 2/2012 | Kim | H01L 27/322 |
| | | | 313/504 |
| 2012/0199856 A1 | 8/2012 | Koresawa et al. | |
| 2014/0117842 A1* | 5/2014 | Hanamura | H01L 27/322 |
| | | | 313/504 |

FOREIGN PATENT DOCUMENTS

| JP | 2014-089803 | 5/2014 |
|---|---|---|
| KR | 10-2012-0065416 | 6/2012 |
| KR | 10-2013-0046302 | 5/2013 |
| KR | 10-2013-0072032 | 7/2013 |

* cited by examiner

ORGANIC LIGHT EMITTING DISPLAY DEVICE COMPRISING COLOR FILTERS AND METHOD OF MANUFACTURING THE SAME

CROSS REFERENCE TO RELATED APPLICATION

This application claims priority from and the benefit of Korean Patent Application No. 10-2014-0190563 filed on Dec. 26, 2014, which is hereby incorporated by reference for all purposes as if fully set forth herein.

BACKGROUND

Field

Exemplary embodiments relate to an organic light emitting display device and a method of manufacturing the same.

Discussion of the Background

Organic light emitting display devices are self-illuminating display devices in which voltages are applied to an anode, a cathode, and an organic light emitting layer interposed between the anode and the cathode to recombine electrons and holes in the organic light emitting layer, thus generating light.

Organic light emitting display devices typically have color filters arranged in an optical path so as to prevent contrast from being reduced by external light. Organic light emitting display devices may display in color by passing white light emitted from the organic light emitting layer through the color filters to produce colored light.

Color filters employed in organic light emitting display devices may be manufactured by a photolithography technique or an inkjet technique. Methods of manufacturing color filters by a photolithography technique include forming a black matrix on a substrate and then forming red, green, and blue filters sequentially, thus increasing manufacturing time when compared with other methods of manufacturing color filters. For example, methods of manufacturing color filters by an inkjet technique include forming a black matrix on a substrate and forming red, green, and blue filters at the same time, thus shortening manufacturing time compared to the photolithography technique. However, these methods using an inkjet technique may suffer from color mixture defects caused by bank defects or degradation of droplet directionality of an inkjet head.

The above information disclosed in this Background section is only for enhancement of understanding of the background of the inventive concept, and, therefore, it may contain information that does not form the prior art that is already known in this country to a person of ordinary skill in the art.

SUMMARY

Exemplary embodiments of the inventive concept provide an organic light emitting display device having a structure for preventing color mixture defects of a color filter.

Exemplary embodiments of the inventive concept also provide a method of manufacturing an organic light emitting display device capable of preventing color mixture defects caused by bank defects or degradation of droplet directionality of an inkjet head.

Exemplary embodiments of the inventive concept also provide a method of manufacturing an organic light emitting display device capable of simplifying processes of manufacturing a color filter.

Exemplary embodiments also provide a method of manufacturing an organic light emitting display device capable of reducing an amount of material used in manufacturing a color filter.

Additional aspects will be set forth in the detailed description which follows, and, in part, will be apparent from the disclosure, or may be learned by practice of the inventive concept.

An exemplary embodiment of the inventive concept discloses an organic light emitting display device including: a substrate; first electrodes disposed on the substrate; an organic light emitting layer formed on the first electrodes; a second electrode disposed on the organic light emitting layer; and a color filter layer formed on the second electrode. The color filter layer includes a first color filter, a second color filter, and a third color filter. The second color filter and the third color filter are disposed in one or more pixel blocks included in the first color filter.

An exemplary embodiment of the inventive concept also discloses a method of manufacturing an organic light emitting display device including: forming first electrodes on a first substrate; forming an organic light emitting layer on the first electrodes; forming a second electrode on the organic light emitting layer; and forming a color filter layer on the second electrode. Forming the color filter layer includes: forming a first color filter having openings; and forming a second color filter and a third color filter in the openings.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

DETAILED DESCRIPTION OF THE ILLUSTRATED EMBODIMENTS

Figure 1:
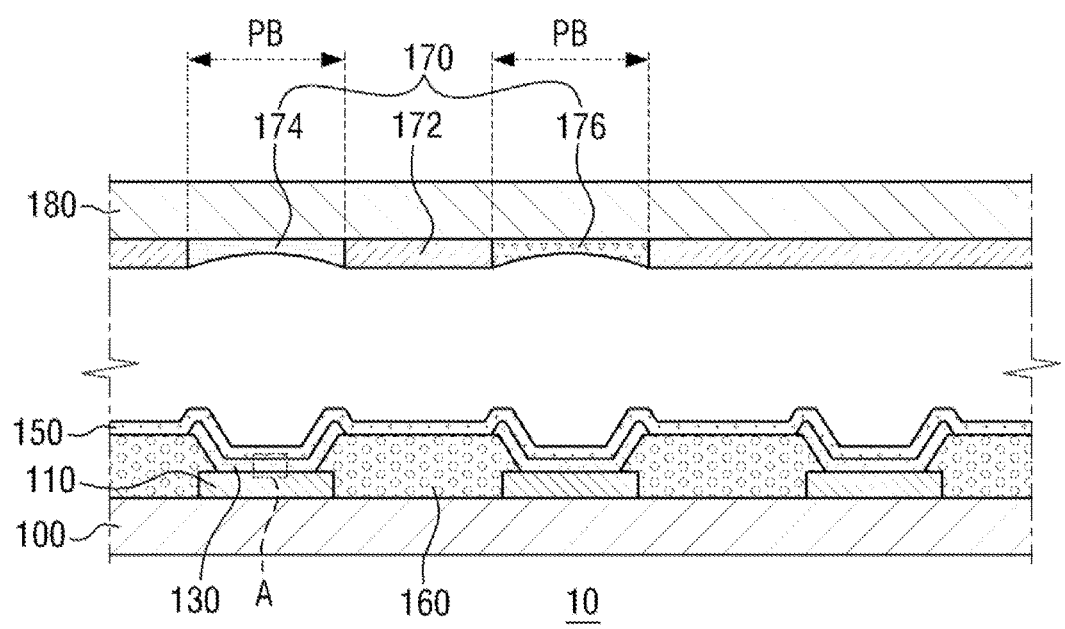
FIG. 1 is a diagram of an organic light emitting display device according to an exemplary embodiment.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.0

Hereinafter, the present invention will be described in detail with reference to the accompanying drawings.

Figure 2:
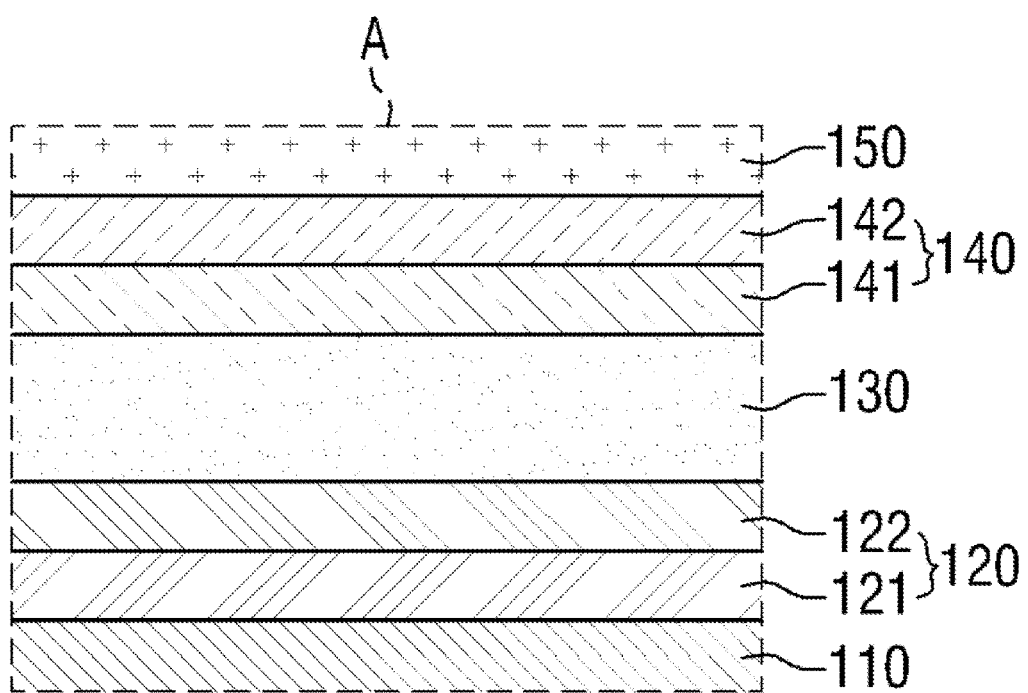
FIG. 2 is a diagram illustrating portion A of FIG. 1.

FIG. 1 is a diagram of an organic light emitting display device according to an exemplary embodiment. FIG. 2 is a diagram illustrating portion A of FIG. 1.

Referring to FIGS. 1 and 2, an organic light emitting display device 10 according to an exemplary embodiment includes a substrate 100, a plurality of first electrodes 110 and second electrodes 150 arranged on the substrate 100 such that the first electrodes 110 and the second electrodes 150 face with each other, an organic light emitting layer 130 interposed between the first electrodes 110 and the second electrodes 150, and a color filter layer 170. A first charge transfer region 120 may be interposed between the first electrodes 110 and the organic light emitting layer 130. A second charge transfer region 140 may be interposed between the organic light emitting layer 130 and the second electrodes 150.

Either the first electrode 110 or the second electrode 150 may be an anode electrode and the other may be a cathode electrode. Either the first charge transfer region 120 or the second charge transfer region 140 may serve to transfer holes and the other may serve to transfer electrons.

In the exemplary embodiment shown in FIGS. 1 and 2, the first electrode 110 is illustrated as an anode electrode and the second electrode 150 is illustrated as a cathode electrode. Accordingly, the first charge transfer region 120 adjacent to the anode electrode is illustrated as a hole transfer region, and the second charge transfer region 140 adjacent to the cathode electrode is illustrated as an electron transfer region.

The substrate 100 may be an insulating substrate, but the type of insulating substrate may vary. For example, when the organic light emitting display device 10 is a bottom emission type or a double-sided emission type, a transparent substrate may be used as the insulating substrate. For example, when the organic light emitting display device 10 is a top emission type, a transparent substrate, a semi-transparent substrate, or an opaque substrate may be used as the insulating substrate.

The insulating substrate may be formed of a material such as, for example, glass, quartz, and/or a polymer resin. Examples of the polymer material may be polyethersulphone (PES), polyacrylate (PA), polyarylate (PAR), polyetherimide (PEI), polyethylene naphthalate (PEN), polyethylene terephthalate (PET), polyphenylene sulfide (PPS), polyallylate, polyimide (PI), polycarbonate (PC), cellulose triacetate (CAT or TAC), cellulose acetate propionate (CAP), or a combination thereof. In some exemplary embodiments, the insulating substrate may be a flexible substrate formed of a flexible material such as polyimide (PI).

Although not shown in the drawings, the substrate 100 may further include other structures disposed on the insulating substrate. Examples of the other structures may be a wire, an electrode, an insulating layer and the like. In some exemplary embodiments, the substrate 100 may include a plurality of thin film transistors disposed on the insulating substrate. The drain electrode of at least some of the plurality of thin film transistors may be electrically connected to the first electrode 110. The thin film transistors may include an active region formed of amorphous silicon, polycrystalline silicon, single crystal silicon, or the like, but is not limited thereto. For example, in another exemplary embodiment, the thin film transistors may include an active region formed of an oxide semiconductor.

Referring back to FIGS. 1 and 2, the first electrode 110 is disposed on the substrate 100. The first electrode 110 may be disposed in each pixel of the organic light emitting display device 10. The first electrode 110 may include a conductive material having a higher relative work function when compared with the second electrode 150. For example, the first electrode 110 may include indium-tin-oxide (ITO), indium-zinc-oxide (IZO), zinc oxide (ZnO), indium oxide ($In_2O_3$), and/or the like. These conductive materials have a high relative work function and are transparent. Thus, when the organic light emitting display device 10 is a bottom emission type or a double-sided emission type, the first electrode 110 may be formed of a conductive layer including the above-enumerated conductive materials or a lamination thereof. When the organic light emitting display device 10 is a top emission type, the first electrode 110 may further include, a reflective material, for example, silver (Ag), magnesium (Mg), aluminum (Al), platinum (Pt), lead (Pb), gold (Au), nickel (Ni), neodymium (Nd), iridium (Ir), chrome (Cr), lithium (Li), calcium (Ca), and/or a mixture thereof. Thus, the first electrode 110 may have a single layer structure formed of the above-enumerated conductive materials and reflective materials, or a multiple layer structure formed by laminating the single layers. When the multiple layer structure is used in the organic light emitting display device 10, the upper layer of the first electrode 110 disposed adjacent to the first charge transfer region 120 may be formed of a conductive material having a relatively high work function. For example, the first electrode 110 may have a multiple layer structure of ITO/Mg, ITO/MgF, ITO/Ag, ITO/Ag/ITO, however, the first electrode 110 is not limited thereto.

The first charge transfer region 120 may be arranged on the first electrode 110. The first charge transfer region 120 may have a structure of a single layer formed of a single material, a structure of a single layer formed of a plurality of materials different from each other, or a structure of multiple layers formed of a plurality of materials different from each other. Although not shown, the first charge transfer region 120 may further include a buffer layer and a first charge blocking layer as needed. Although it is illustrated in FIG. 2 that the first charge transfer region 120 includes a first charge injection layer 121 and a first charge transport layer 122, either the first charge injection layer 121 or the first charge transport layer 122 may be omitted, or the first charge injection layer 121 and the first charge transport layer 122 may be constructed into a single layer.

The first charge injection layer 121 is formed on the first electrode 110, and serves to improve efficiency of hole injection from the first electrode 110 to the organic light emitting layer 130. Specifically, the first charge injection layer 121 lowers an energy barrier to enable more effective injection of holes.

The first charge injection layer 121 may include a phthalocyanine compound such as copper phthalocyanine (CuPc), m-MTDATA(4,4',4"-tris(N-3-methylphenyl-N-phenylamino)triphenylamine), TDATA(4,4',4"-tris(diphenylamino)triphenylamine), 2-TNATA(4,4',4"-tris[2-naphthyl(phenyl)-amino]triphenyl-amine), Pani/DBSA (polyaniline/Dodecylbenzenesulfonic acid), PEDOT/PSS (Poly(3,4-ethylene dioxythiophene)/polystyrene sulfonate), PANI/CSA (polyaniline/camphorsulfonic acid) or PANI/PSS (polyaniline/polystyrene sulfonate), and/or the like.

The first charge transport layer 122 is formed on the first charge injection layer 121, and serves to transport the holes injected to the first charge injection layer 121 to the organic light emitting layer 130. The first charge transport layer 122 may have optimized hole transport efficiency when the energy of the highest occupied molecular orbital (HOMO) is substantially lower than the work function of the material forming the first electrode 110 and substantially higher than the energy of the highest occupied molecular orbital (HOMO) of the first organic light emitting layer 130. The first charge transport layer 122 may include, for example, NPD(4,4'-bis[N-(1-naphthyl)-N-phenyl-amino] biphenyl), TPD(N,N'-diphenyl-N,N'-bis[3-methylphenyl]-1,1'-biphenyl-4,4'-diamine), s-TAD(2,2',7,7'-tetrakis-(N,N-diphenylamino)-9,9'-spirobifluorene), m-MTDATA(4,4',4"-tris (N-3-methylphenyl-N-phenylamino)triphenylamine) and/or the like, however, the first charge transport layer 122 is not limited thereto.

The first charge transfer region 120 may further include a charge generating material for improving conductivity in addition to the aforementioned materials. The charge generating material may be homogeneously or non-homogeneously dispersed in the first charge transfer region 120. The charge generating material may be, for example, a p-dopant. The p-dopant may be one of quinone derivatives, metal oxides and cyano group-containing compounds, but is not limited thereto. In a non-limiting example, the p-dopant may be quinone derivatives such as TCNQ(Tetracyanoquinodimethane) and/or F4-TCNQ(2,3,5,6-tetrafluoro-tetracyanoquinodimethane), and metal oxides such as tungsten oxides and/or molybdenum oxides.

As mentioned above, the first charge transfer region 120 may further include at least either the buffer layer or the first charge blocking layer (not shown). The buffer layer may serve to compensate for a resonance distance according to a wavelength of light emitted from the organic light emitting layer 130, thereby increasing light emission efficiency. The buffer layer may include any material that can be included in the first charge transfer region 120. The first charge blocking layer may serve to prevent a charge injection from the second charge transfer region 140 to the first charge transfer region 120.

The organic light emitting layer 130 is formed on the first charge transfer region 120. The organic light emitting layer 130 may be formed of any material that can be generally used as a material for a light emitting layer, and may be formed of, for example, red, green, and blue light emitting materials. The organic light emitting layer 130 may include a fluorescent material or a phosphorescent material.

In exemplary embodiments, the organic light emitting layer 130 may include a host and a dopant.

The host may be, for example, Alq3(tris-(8-hydroyquinolato) aluminum(III)), CBP(4,4'-N,N'-dicarbazole-biphenyl), PVK(poly(N-vinylcarbazole)), ADN(9,10-Bis(2-naphthalenyl)anthracene), TCTA(4,4',4"-tris(N-carbazolyl)triphenylamine), TPBi(1,3,5-tris(N-phenylbenzimiazole-2-yl) benzene), TBADN(2-(t-butyl)-9, 10-bis (20-naphthyl) anthracene), DSA(distyrylarylene), CDBP(4,4'-bis(9-carbazolyl)-2,2'-dimethyl-biphenyl), MADN(2-methyl-9,10-bis (naphthalene-2-yl)anthracene), and/or the like.

The dopant may be both a fluorescent dopant and a phosphorescent dopant. The type of the dopant may vary according to the emitted color of the organic light emitting layer 130.

A red dopant may be, for example, a fluorescent material, such as PBD:Eu(DBM)3(Phen)(2-biphenyl-4-yl-5-(4-t-butylphenyl)-1,3,4-oxadiazole:tris(dibenzoylmethane) mono (1,10-phenanthroline)europium(lll)) or perylene. Alternatively, the red dopant may be a phosphorescent material, such as a metal complex, or an organometallic complex such as PIQIr(acac)(bis(1-phenylisoquinoline)acetylacetonate iridium), PQIr(acac)(bis(1-phenylquinoline)acetylacetonate iridium), PQIr(tris(1-phenylquinoline)iridium), and/or PtOEP(octaethylporphyrin platinum).

A green dopant may be, for example, a fluorescent material such as Alq3(tris-(8-hydroyquinolato) aluminum(III)). The green dopant may be a phosphorescent material, for example, Ir(ppy)3(fac-tris(2-phenylpyridine)iridium), Ir(ppy)2(acac)(bis(2-phenylpyridine)(acetylacetonate) iridium(III)), Ir(mpyp)3(2-phenyl-4-methyl-pyridine iridium), and/or the like.

A blue dopant may be, for example, a fluorescent material such as spiro-DPVBi(spiro-4,'-bis(2,2'-diphenylvinyl)1,1'-biphenyl), spiro-6P (spiro-sixphenyl), distyrylbenzene (DSB) based, distyrylarylene (DSA) based, and polyfluorene (PFO) based polymers and poly(p-phenylene vinylene) (PPV) based polymer. Alternatively, the blue dopant may be a phosphorescent material, for example, F2Irpic(bis[2-(4,6-difluorophenyl)pyridinato-N,C2']iridium picolinate), (F2ppy)2Ir(tmd)(bis[2-(4,6-difluorophenyl)pyridinato-N, C2']iridium 2,2,6,6-tetramethylheptane-3,5-dione), Ir(df-ppz)3(tris[1-(4,6-difluorophenyl)pyrazolate-N,C2']iridium), and/or the like.

The second charge transfer region 140 may be arranged on the organic light emitting layer 130. The second charge transfer region 140 may have a structure of a single layer formed of a single material, a structure of a single layer formed of a plurality of materials different from each other, or a structure of multiple layers formed of a plurality of materials different from each other. The second charge transfer region 140 may further include a second charge blocking layer depending on the application of the device. Although it is illustrated in FIG. 2 that the second charge transfer region 140 includes a second charge transport layer 141 and a second charge injection layer 142, either the second charge transport layer 141 or the second charge injection layer 142 may be omitted, or the second charge transport layer 141 and a second charge injection layer 142 may be constructed into a single layer.

The second charge transport layer 141 is formed on the organic light emitting layer 130, and serves to transport the electrons injected from the second charge injection layer 142 to the organic light emitting layer 130.

The second charge transport layer 141 may include Alq3 (tris-(8-hydroyquinolato) aluminum(III)), TPBi(1,3,5-tris (N-phenylbenzimiazole-2-yl)benzene), BCP(2,9-dimethyl-4,7-diphenyl-1,10-phenanthroline), Bphen(4,7-diphenyl-1, 10-phenanthroline), TAZ(3-(biphenyl-4-yl)-5-(4-tert-butylphenyl)-4-phenyl-4H-1,2,4-triazole), NTAZ(4-(naphthalene-1-yl)-3,5-diphenyl-4H-1,2,4-triazole), tBu-PBD(2-(4-biphenylyl)-5-(4-tert-butyl-phenyl)-1,3,4-oxadiazole), BAlq(bis(2-methyl-8-quinolinolato-N1,O8)-(1, 1'-biphenyl-4-olato)aluminum), Bebq2(bis(10-hydroxybenzo[h]quinolinato)beryllium), ADN(9,10-bis(2-naphthyl)anthracene) and/or a mixture thereof, but the second charge transport layer 141 is not limited thereto.

The second charge injection layer 142 is formed on the second charge transport layer 141, and serves to improve efficiency of electron injection from the second electrode 150 to the organic light emitting layer 130.

The second charge injection layer 142 may be formed of lanthanum-family metal such as LiF, LiQ(lithium quinolate), Li$_2$O, BaO, NaCl, CsF, and/or Yb, or metal halide such as RbCl and/or RbI, but is not limited thereto. The second charge injection layer 142 may also be formed of a mixture of the above-enumerated materials and an insulating organo metal salt. The employed organo metal salt may be a material having an energy band gap of approximately 4 eV. For example, the organo metal salt may include metal acetate, metal benzoate, metal acetoacetate, metal acetylacetonate, or metal stearate.

As mentioned above, the second charge transfer region 140 may further include a second charge blocking layer. The second charge blocking layer may include, for example, at least either BCP(2,9-dimethyl-4,7-diphenyl-1,10-phenanthroline) or Bphen(4,7-diphenyl-1,10-phenanthroline), but is not limited thereto.

The second electrode 150 is disposed on the second charge transfer region 140. The second electrode 150 may be a front electrode or a common electrode formed without being defined on a pixel basis. The second electrode 150 may include a conductive material having a lower relative work function when compared with the first electrode 110.

For example, the second electrode 150 may include Li, Ca, LiF/Ca, LiF/Al, Al, Mg, Ag, Pt, Pd, Ni, Au, Nd, Ir, Cr, BaF, Ba and/or a compound thereof or a mixture thereof (for example, a mixture of Ag and Mg, etc.). The second electrode 150 may further include an auxiliary electrode. The auxiliary electrode may include a film formed by depositing the above-enumerated materials, and a transparent metal oxide formed on the film, for example, indium-tin-oxide (ITO, indium-zinc-oxide (IZO), zinc oxide (ZnO), indium-tin-zinc-oxide, etc.

In a case where the organic light emitting display device 10 is a bottom emission type, the second electrode 150 may be a single or laminated aforementioned conductive layer having a relatively low work function, or may be a conductive layer having laminated on a reflective material layer. In a case where the organic light emitting display device 10 is a top emission type, the second electrode 150 may be formed of a thin conductive layer having a relatively low work function, and a transparent conductive film laminated on the thin conductive layer. The transparent conductive film may include, for example, an indium-tin-oxide (ITO) layer, indium-zinc-oxide (IZO) layer, zinc oxide (ZnO) layer, indium oxide (In$_2$O$_3$) layer, etc.

A pixel define layer (PDL) 160 may be formed between a plurality of first electrodes 110. Specifically, the pixel define layer 160 may overlap with ends of the first electrode 110 so as to define the first electrodes 110 on a pixel basis. The pixel define layer 160 may be an insulating layer which electrically insulates the plurality of first electrodes 110.

As shown in FIG. 1, the pixel define layer 160 may cover only a portion of an upper surface of the first electrode 110. The residual part of the first electrode 110 not covered by the pixel define layer 160 may form an opening. The organic light emitting layer 130 may be formed on the opening. The organic light emitting layer 130 is not limited as being formed only in a restricted region of the opening as shown in FIG. 1, but may be formed, for example, even to a portion of the pixel define layer 160.

The color filter layer 170 is formed on the second electrode 150. The color filter layer 170 may include a plurality of filters which selectively transmit only light of a specific wavelength. In some exemplary embodiments, the color filter layer 170 may include, as shown in FIG. 1, a first color filter 172, a second color filter 174, and a third color filter 176. The first color filter 172, the second color filter 174, and the third color filter 176 may be formed on a transparent substrate 180. Each of the first color filter 172, the second color filter 174, and the third color filter 176 may transmit light of different wavelengths. That is, the first color filter 172 may selectively transmit first color of light, the second color filter 174 may selectively transmit second color of light, and the third color filter 176 may selectively transmit third color of light.

The first color filter 172 may include one or more pixel blocks PB. The pixel blocks PB may be a region corresponding to the organic light emitting layer 130, and/or regions corresponding to the respective plural first electrodes 110. The light emitted from the organic light emitting layer 130 may be selectively transmitted through the corresponding color filter layer. The second color filter 174 and the third color filter 176 may be disposed in one or more pixel blocks PB of the first color filter 172. The pixel blocks PB may include an opening as shown in FIG. 1. That is, the first color filter 172 may include openings, and the second color filter 174 and the third color filter 176 may be disposed in openings of the first color filter 172.

In some exemplary embodiments, the first color filter 172, the second color filter 174, and the third color filter 176 may be formed through different processes, and therefore, the portions of color filter layer 170 formed by color filters 172, 174 and 176 may have different surface shapes. For example, the surface of the first color filter 172 may be relatively flat when compared with the surfaces of the second color filter 174 and the third color filter 176, as shown in FIG. 1. In other words, the surfaces of the second color filter 174 and the third color filter 176 may be relatively curved when compared with the surface of the first color filter 172. However, the shapes of the surfaces of the first color filter 172, the second color filter 174, and the third color filter 176 are not limited thereto. For example, the surface of each of the first color filter 172, the second color filter 174, and the third color filter 176 may be all flat or all curved.

In some exemplary embodiments, the first color filter 172, the second color filter 174 and the third color filter 176 may be formed through different processes, and therefore, the portions of color filter layer 170 formed by the color filters 172, 174, and 176 may be formed of different materials. For example, the first color filter 172 may be formed of a polymer material when the first color filter 172 is formed through a photolithography process, and the second color filter 174 and the third color filter 176 may be formed of an ink material when the color filters 174 and 176 are formed through an inkjet process. However, these are only illustrative examples, and the materials of the first color filter 172, the second color filter 174, and the third color filter 176 are not limited thereto.

In some exemplary embodiments, the first color filter 172 may be implemented as a filter layer for the color of light having the lowest sensitivity of luminosity when compared with the second color filter 174 and the third color filter 176. Additionally or alternatively, the first color filter 172 may be implemented as a filter layer for the color of light having the lowest transmittivity when compared with the second color filter 174 and the third color filter 176.

In detail, when the organic light emitting display device 10 according to an exemplary embodiment uses red, green and blue colors as basic color of light for expressing images, the first color filter 172 may be implemented as a filter layer for the blue light which has the lowest sensitivity of luminosity/transmittivity among the red, green and blue colors. Thus, in a case where the first color filter 172 is implemented as a filter layer for the color of light having the lowest sensitivity of luminosity/transmittivity among the basic color of light, the quality of the image being displayed may be improved when compared with the case where the first color filter 172 is formed otherwise.

The organic light emitting display device 10 according to an exemplary embodiment may not have a separate black matrix. However, the first color filter 172 may serve as both a black matrix and a filter layer for a first color. That is, the first color filter 172 may be disposed in a non-pixel region of the organic light emitting display element so as to prevent light leakage at the interface between the non-pixel region and a pixel region, thus improving contrast. The first color filter 172 may be disposed in a part of the pixel region of the organic light emitting display element so as to selectively transmit first color of light.

Although not shown, the organic light emitting display device 10 according to an exemplary embodiment may include a microcavity so as to achieve improved luminous efficiency and prevent degradation of color purity. Accordingly, the organic light emitting display device 10 according to an exemplary embodiment may be structured such that the optical thickness between the first electrode corresponding to the first color filter 172 among the plurality of the first electrodes 110 and the second electrode 150, the optical thickness between the first electrode corresponding to the second color filter 174 among the plurality of the first electrodes 110 and the second electrode 150, and the optical thickness between the first electrode corresponding to the third color filter 176 among the plurality of the first electrodes 110 and the second electrode 150 may be different. For example, in a case where the first color is blue, the second color is red, and the third color is green, the optical thickness corresponding to the second color filter 174 may be the thickest, the optical thickness corresponding to the third color filter 176 may be the next thickest, and the optical thickness corresponding to the first color filter 172 may be the least thick.

Figure 3:
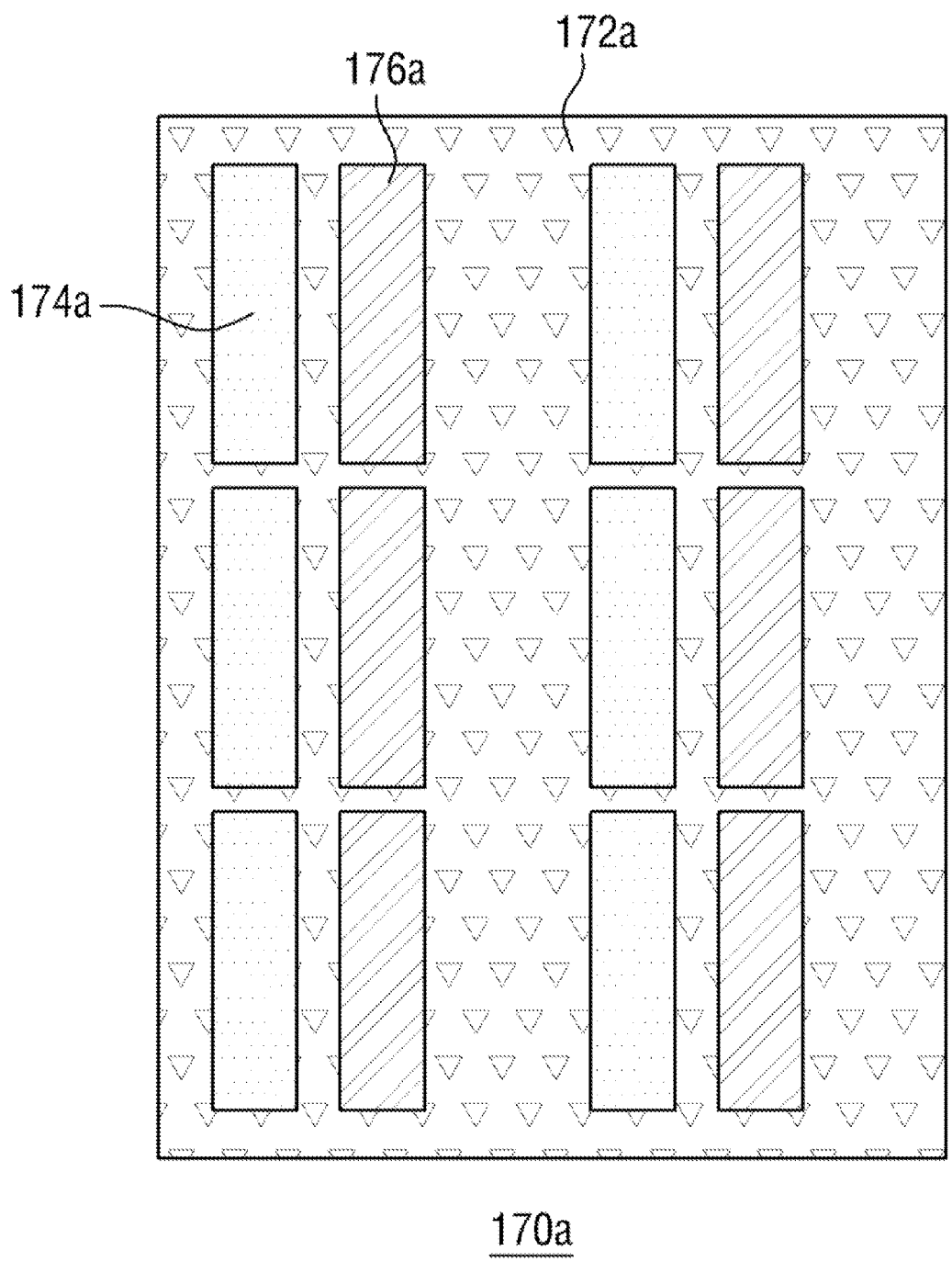
FIG. 3 is a plan view of a color filter layer of the organic light emitting display device according to the exemplary embodiment shown in FIG. 1.
Figure 4:
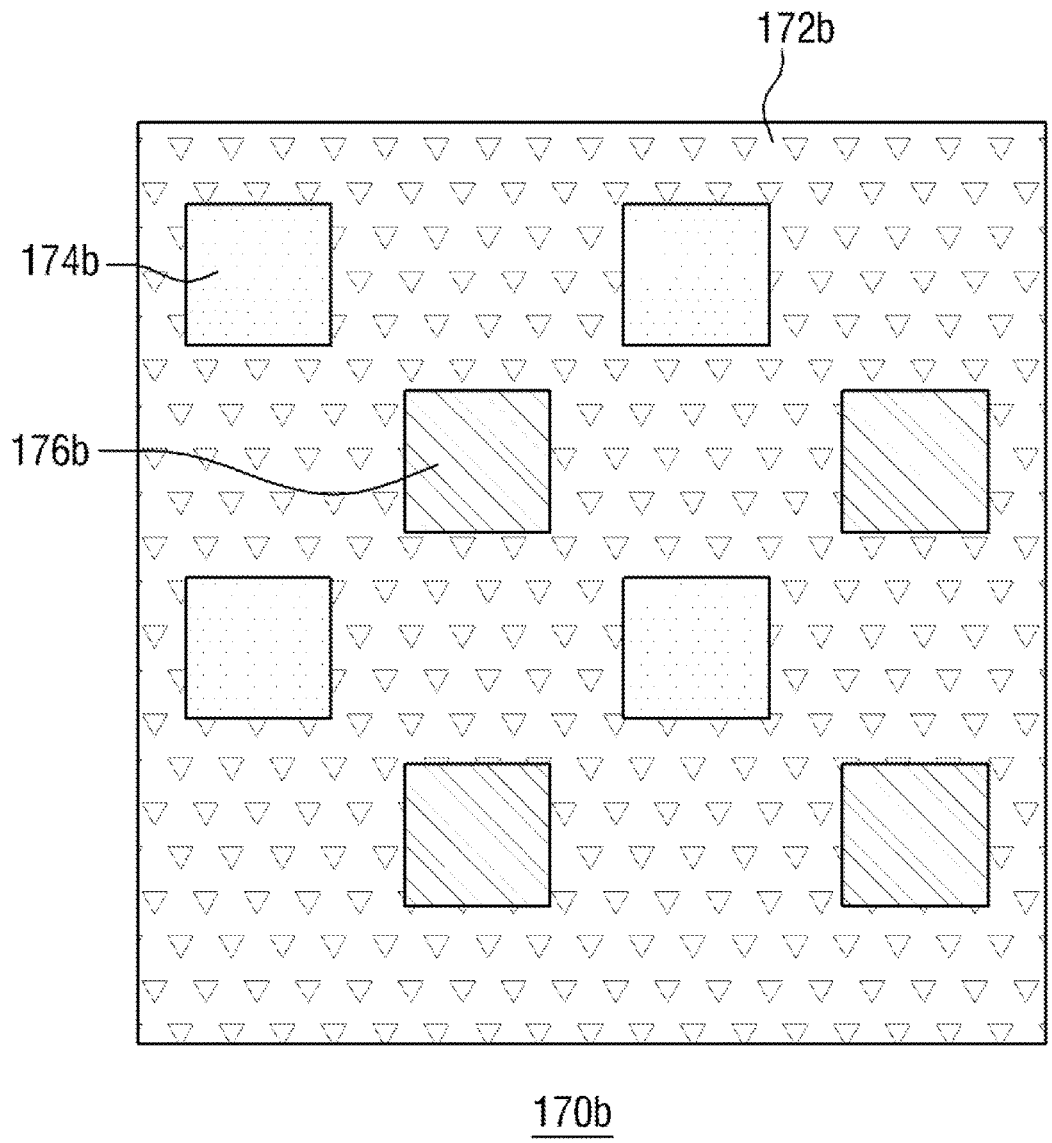
FIG. 4 is a plan view of a color filter layer of an organic light emitting display device according to another exemplary embodiment.

FIG. 3 is a plan view of a color filter layer of the organic light emitting display device according to an exemplary embodiment. FIG. 4 is a plan view of a color filter layer of an organic light emitting display device according to an exemplary embodiment.

Referring to FIG. 3 a color filter layer 170a may include a first color filter 172a, a second color filter 174a and a third color filter 176a. As shown in FIG. 3, the first color filter 172a may form a background of the color filter layer 170a. The first color filter 172a may include one or more pixel blocks in which and the second color filter 174a and the third color filter 176a may be disposed.

As shown in FIG. 3, each of the second color filter 174a and the third color filter 176a may be implemented as a rectangular shape elongated in one direction and be completely surrounded by the first color filter 172a. The first color filter 172a may be continuous in a plan view. The second color filter 174a and the third color filter 176a may be recursively arranged in one direction with a set spacing, but are not limited thereto. For example, the second color filter 174a and the third color filter 176a may be recursively arranged in the direction perpendicular to the above direction with a predetermined spacing different from the above-described spacing.

In a case where the first color filter 172a includes a plurality of pixel blocks as shown in FIG. 3, the second color filter 174a may be disposed in any of the plurality of pixel blocks and the third color filter 176a may be disposed in any other pixel block among the plurality of pixel blocks.

Referring now to FIG. 4, a color filter layer 170b includes a first color filter 172b, a second color filter 174b and a third color filter 176b. As shown in FIG. 4, the first color filter 172b may form a background of the color filter layer 170b. The first color filter 172b may include one or more pixel blocks in which and the second color filter 174b and the third color filter 176b may be disposed.

In detail, each of the second color filter 174b and the third color filter 176b may be implemented as a square shape as shown in FIG. 4. The second color filter 174b and the third color filter 176b may be recursively arranged in one direction and in a direction perpendicular to the one direction with a set spacing.

In a case where the first color filter 172b includes a plurality of pixel blocks as shown in FIG. 4, the second color filter 174b may be disposed in any of the plurality of pixel blocks and the third color filter 176b may be disposed in any other pixel block among the plurality of pixel blocks.

As shown in FIG. 4, the second color filter 174b and the third color filter 176b may be arranged in a diagonal direction from each other. That is, when a plurality of second color filters 174b are disposed in a series of rows and columns in plan view, the third color filter 176b is disposed in a row and column not occupied by the plurality of second color filters 174b In other words, the third color filter 176b may be arranged diagonally to the second color filter 174b.

If the second color filter 174b and the third color filter 176b are arranged in a diagonal direction as shown in FIG. 4, color mixture defects caused when a the second color filter 174b and the third color filter 176b are overlapped with each other may be prevented, as compared with the case in which the second color filter 174b and the third color filter 176b are arranged more close to each other.

Now, a method of manufacturing the organic light emitting display device 10 according to an exemplary embodiment will be explained.

Figure 7:
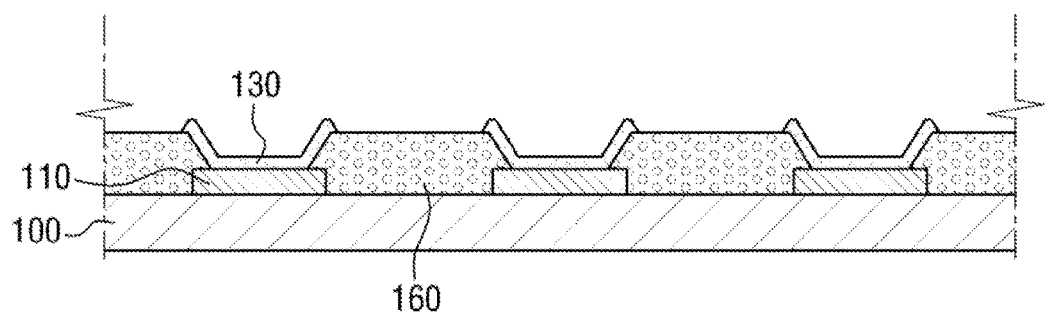
Figure 8:
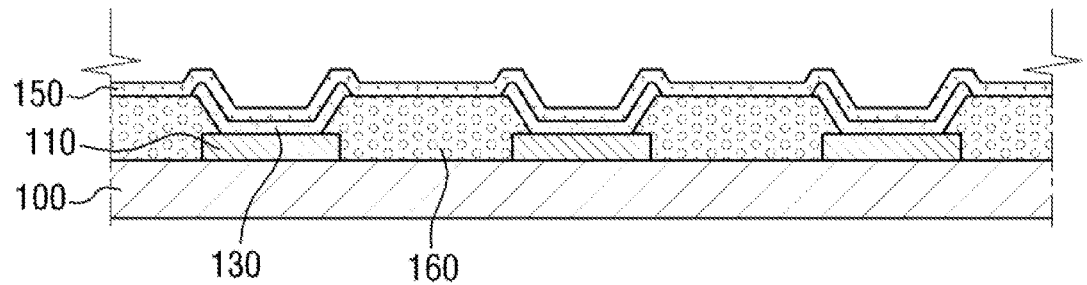
Figure 9:
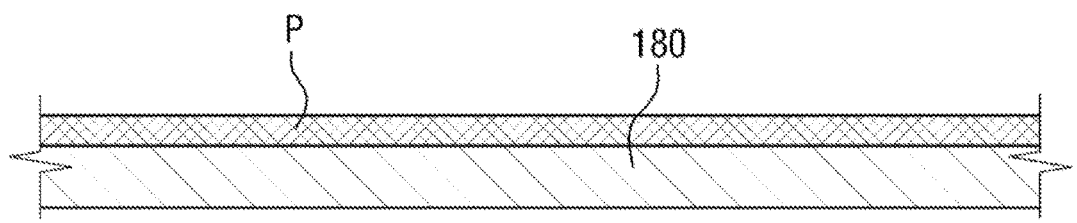
Figure 10:
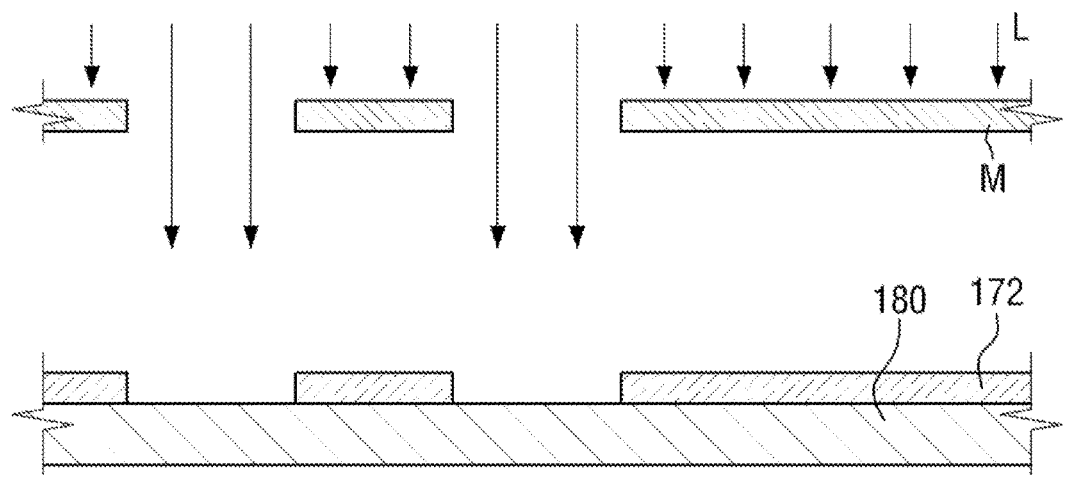
Figure 11:
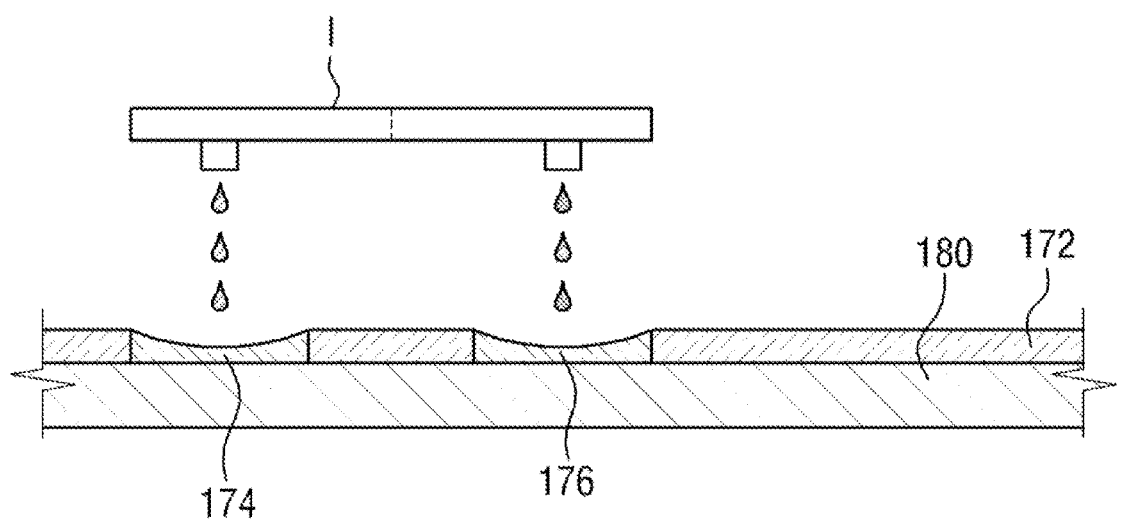

FIGS. 5 to 12 are diagrams illustrating a method of manufacturing the organic light emitting display device according to an exemplary embodiment. Specifically, FIGS. 5 to 8 are diagrams illustrating a method of manufacturing an organic light emitting display element of the organic light emitting display device, and FIGS. 9 to 11 are diagrams illustrating a method of manufacturing a color filter layer of the organic light emitting display device.

The method of manufacturing the organic light emitting display device according to an exemplary embodiment may include manufacturing an organic light emitting display element, manufacturing a color filter layer, and coupling the organic light emitting display element and the color filter layer.

Hereinafter, the method of manufacturing an organic light emitting display element will be explained prior to the method of manufacturing a color filter layer as an illustrative example, however, manufacturing an organic light emitting display element is not limited to being performed prior to manufacturing a color filter layer. That is, the color filter layer may be manufactured prior to the organic light emitting display element or may be manufactured at the same time.

Figure 5:
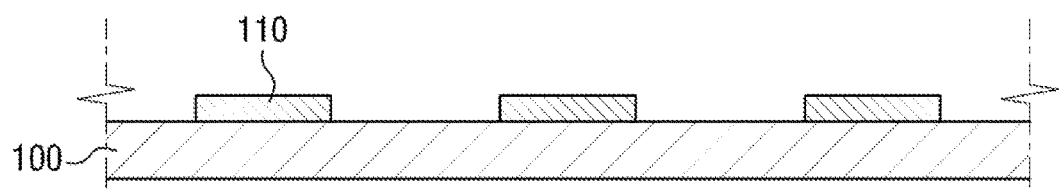
FIGS. 5, 6, 7, 8, 9, 10, 11, and 12 are diagrams illustrating a method of manufacturing the organic light emitting display device according an exemplary embodiment.

First, a method of manufacturing an organic light emitting display device will be explained. The method of manufacturing the organic light emitting display device according to an exemplary embodiment may include a series of steps to be performed in order. Referring to FIG. 5, the plurality of electrodes 110 are formed on the substrate 100.

Figure 6:
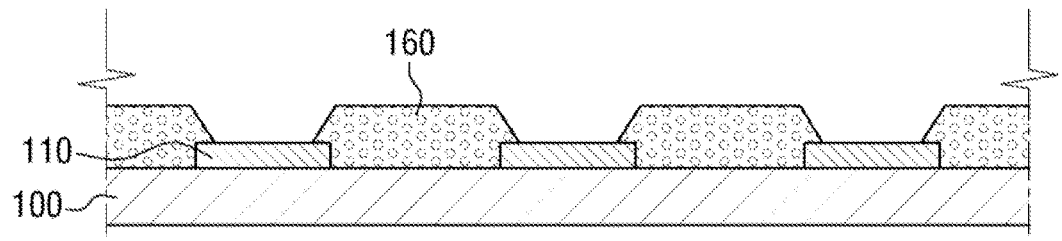

Now, referring to FIG. 6, the pixel define layer 160 is formed between the plurality of first electrodes 110. The pixel define layer 160 may cover only a portion of an upper surface of the first electrode 110. That is, the pixel define layer 160 may overlap with ends of the first electrode 110 as shown in FIG. 6.

Referring to FIG. 7, the organic light emitting layer 130 is formed on the plurality of first electrodes 110. In some exemplary embodiments, as shown in FIG. 7, the organic light emitting layer 130 may be formed in the opening where the pixel define layer 160 is not formed on the plurality of first electrodes 110. The organic light emitting layer 130 may be formed on a portion of the pixel define layer 160 as shown in FIG. 7. However, the organic light emitting layer 130 is not limited thereto, and may be formed only in the opening where the pixel define layer 160 is not formed on the first electrodes 110, and may not be formed on the pixel define layer 160.

Referring to FIG. 8, the second electrode 150 is formed on the organic light emitting layer 130 and the pixel define layer 160. As shown in FIG. 8, the second electrode 150 may be implemented as a front electrode or a common electrode formed without being defined on a pixel basis, but is not limited thereto.

The method of forming the color filter layer 170 of the organic light emitting display device 10 will be explained hereinafter.

As described above, the color filter layer 170 of the organic light emitting display device 10 according to an exemplary embodiment includes the first color filter 172, the second color filter 174, and the third color filter 176. The first color filter 172 may be formed through a process different from the processes of forming the second color filter 174 and the third color filter 176.

For example, the first color filter 172 may be formed through a photolithography process, and the second color filter 174 and the third color filter 176 may be formed through an inkjet process. In this case, the first color filter 172 may be formed first through a photolithography process, and then, the second color filter 174 and the third color filter 176 may be formed at the same time through an inkjet process.

Referring to FIG. 9, to form the color filter layer 170, photoresist is deposited on the transparent substrate 180 to obtain a photoresist layer P for manufacturing a color filter. The photoresist layer P for manufacturing a color filter may be formed through a spin coating process, a spraying process, or an immersion process, but is not limited thereto. The photoresist may be positive photoresist or negative photoresist. The photoresist layer P for manufacturing a color filter may include, for example, dye compounds including binder resins, monomers, photoinitiators, and epoxy group, and organic solvents. Optical characteristics of the color filter to be manufactured may be determined by the color produced by the dye compounds.

Referring to FIG. 10, a photomask M with a pattern engraved therein according to the shape of the first color filter 172 to be formed is positioned on the photoresist layer P for manufacturing a color filter. Subsequently, the photoresist layer P for manufacturing a color filter is selectively exposed to light L via the photomask M, and developed to form the first color filter 172 on the transparent substrate 180. Thus, the first color filter 172 may have openings.

Although positive photoresist is described, the portion exposed to light L may be formed as the photoresist layer P for manufacturing a color filter if negative photoresist is used.

Referring now to FIG. 11, the second color filter 174 and the third color filter 176 are formed in openings of the first color filter 172 through an inkjet process. Specifically, ink droplets are discharged into openings of the first color filter 172 by an inkjet head I having a plurality of nozzles, thereby forming the second color filter 174 and the third color filter 176 at the same time.

The ink used for forming the second color filter 174 and the third color filter 176 may include colorants and resin compounds. The colorants may include acid dyes, reactive dyes, disperse dyes, oil soluble dyes and the like, but are not limited thereto. The resin compounds may include thermosetting resin or photocurable resins.

The method of manufacturing the organic light emitting display device according to an exemplary embodiment includes manufacturing a color filter layer by using both a photolithography process and an inkjet process. Thus, the exemplary method does not include a process of forming a separate black matrix, simplifying manufacturing processes and reducing the amount of material used in manufacturing the color filter layer when compared with the method of manufacturing a color filter layer by a photolithography process alone.

Figure 12:
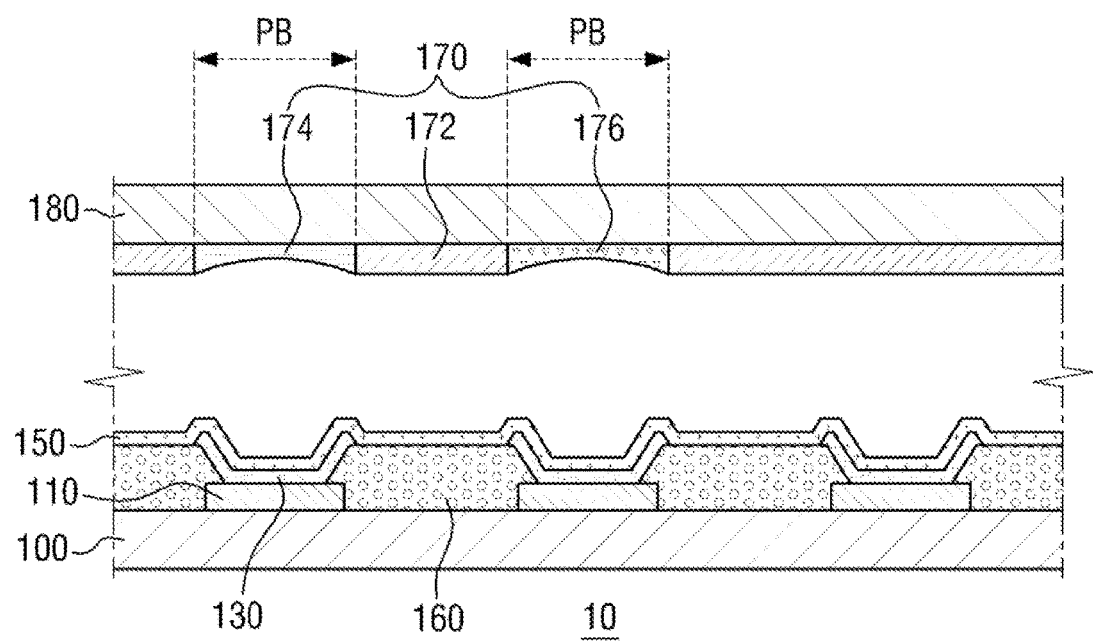

Referring now to FIG. 12, the color filter layer 170 is formed on the second electrode 150 of the organic light emitting display element. That is, the organic light emitting display element and the color filter layer 170 may be coupled with each other in such a manner that the color filter layer 170 may be positioned on the second electrode 150 of the organic light emitting display element. In more detail, as shown in FIG. 12, the organic light emitting display element and the color filter layer 170 may be coupled with each other in such a manner that the surface of the transparent substrate 180 with the color filter layer 170 formed thereon, may face the organic light emitting display element. Although not shown, the organic light emitting display device 10 may further include a sealant interposed between the substrate 100 and the transparent substrate 180 along edges of the two substrates 100 and 180 to join and seal the two substrates 100 and 180 together.

In some exemplary embodiments, the organic light emitting display device 10 may include a space, i.e., an air layer, between the color filter layer 170 and the second electrode 150 as shown in FIG. 1 and FIG. 12. However, this is merely an illustrative example, and the organic light emitting display device 10 may include a protective layer interposed between the color filter layer 170 and the second electrode 150.

Figure 13:
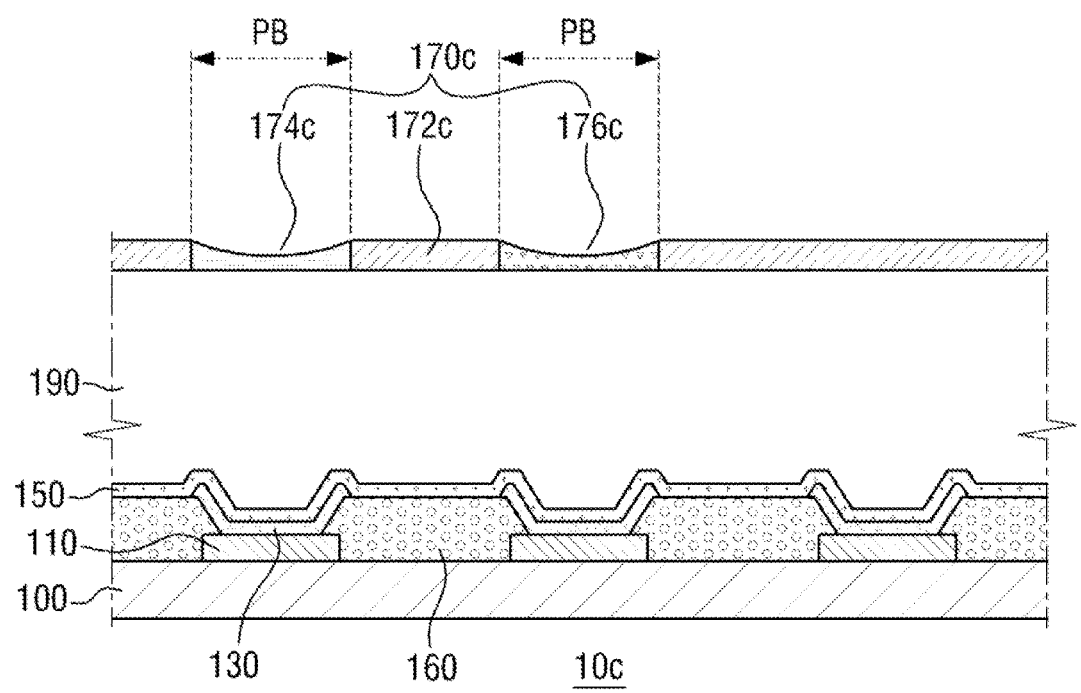
FIG. 13 is a diagram of the organic light emitting display device according to another exemplary embodiment.

FIG. 13 is a diagram of the organic light emitting display device according to another exemplary embodiment.

Referring to FIG. 13, an organic light emitting display device 10c according to another exemplary embodiment is different from the organic light emitting display device 10 of the exemplary embodiment explained with reference to FIG. 1 in that the device 10c includes a color filter layer 170c and a protective layer 190 having different constructions, however, other components of the device 10c may be the same as or similar to those of the device 10. Hereinafter, differences between the two devices 10c and 10 will be explained and duplicated descriptions will be omitted.

In the exemplary embodiment shown in FIG. 13, the protective layer 190 serves to protect the organic light emitting layer 130 from external environmental factors such as moisture an oxygen, and may be formed on the second electrode 150 as shown in FIG. 13. The protective layer 190 may be a thin film encapsulation layer formed by, for example, alternately laminating a plurality of organic layers and a plurality of inorganic layers, or may be implemented as a transparent substrate such as encapsulation glass.

In a case where the protective layer 190 is a thin film encapsulation layer, the protective layer 190 may include a plurality of organic layers and a plurality of inorganic layers which are alternately laminated. The organic layers may include an acrylate-based material, and the inorganic layers may include an oxide-based material, but are not limited thereto.

Referring to FIG. 13, the color filter layer 170c includes a first color filter 172c, a second color filter 174c, and a third color filter 176c. As shown in FIG. 13, the color filter layer 170c may be formed on the protective layer 190. In more detail, the first color filter 172c, the second color filter 174c, and the third color filter 176c may be formed directly on the protective layer 190. However, this is merely an illustrative example, and the color filter layer 170c is not limited thereto.

In some exemplary embodiments, the color filter layer 170 may include the first color filter 172, the second color filter 174, and the third color filter 176 as shown in FIG. 1 and FIG. 12. In this case, the organic light emitting display device 10 according to an exemplary embodiment may use red, green, and blue colors as basic color of light for expressing images. However, this is merely an illustrative example, and basic color of light more than or different than the above three color of light may be used.

Figure 14:
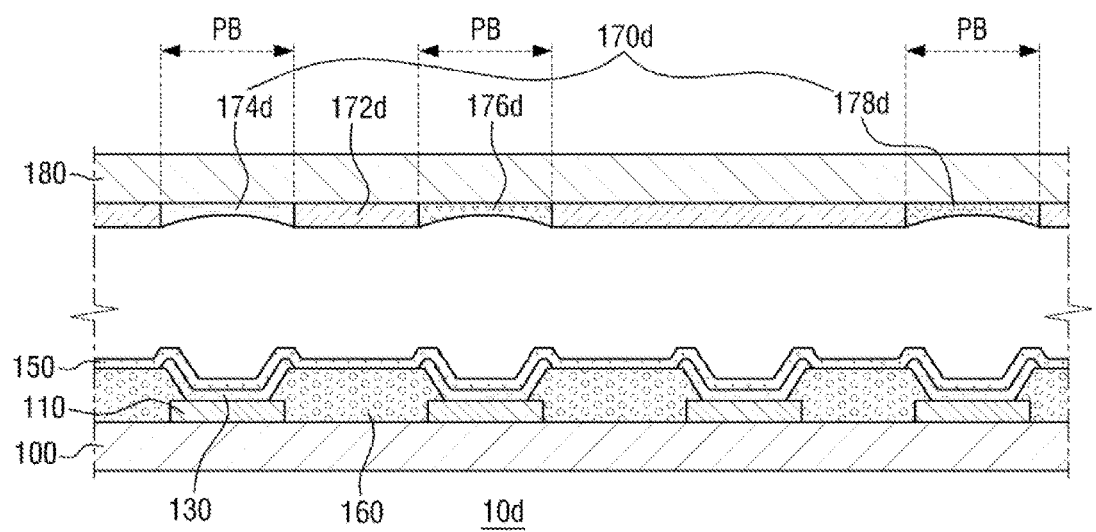
FIG. 14 is a diagram of an organic light emitting display device according to yet another exemplary embodiment.

FIG. 14 is a diagram of an organic light emitting display device according to yet another exemplary embodiment.

Referring to FIG. 14, an organic light emitting display device 10d according to yet another exemplary embodiment is different from the organic light emitting display device 10 of the exemplary embodiment explained with reference to FIG. 1 in that the device 10d includes a color filter layer 170d having a different construction, however, other components of the device 10d may be same with or similar to those of the device 10. Hereinafter, differences between the two devices 10d and 10 will be explained and duplicated descriptions will be omitted.

In the exemplary embodiment shown in FIG. 14, the color filter layer 170d may include a first color filter 172d, a second color filter 174d, a third color filter 176d, and a fourth color filter 178d.

The first color filter 172d, the second color filter 174d, the third color filter 176d, and the fourth color filter 178d may be formed on the transparent substrate 180. Each of the first color filter 172d, the second color filter 174d, the third color filter 176d, and the fourth color filter 178d may transmit light having different wavelengths. That is, the first color filter 172d may selectively transmit first color of light, the second color filter 174d may selectively transmit second color of light, the third color filter 176d may selectively transmit third color of light, and the fourth color filter 178d may selectively transmit fourth color of light.

The first color filter 172d may include one or more pixel blocks PB. The pixel blocks may include openings. The second color filter 174*d*, the third color filter 176*d*, and the fourth color filter 178*d* may be disposed in the pixel blocks PB of the first color filter 172*d*. For example, when the first color filter 172*d* includes a plurality of pixel blocks PB, the second color filter 174*d* may be disposed in any of the plurality of pixel blocks PB, the third color filter 176*d*, may be disposed in any other pixel block PB among the plurality of pixel blocks PB, and the fourth color filter 178*d* may be disposed in any other pixel block not containing second color filter 174*d* or third color filter 176*d* among the plurality of pixel blocks PB.

In some exemplary embodiments, the first color filter 172*d* may be implemented as a filter layer for the color of light having the lowest sensitivity of luminosity when compared with the colors of light passing through the second color filter 174*d*, the third color filter 176*d* and the fourth color filter 178*d*. Additionally or alternatively, the first color filter 172*d* may be implemented as a filter layer for the color of light having the lowest transmittivity when compared with the colors of light passing through the second color filter 174*d*, the third color filter 176*d*, and the fourth color filter 178*d*.

For example, a first color may be blue having the lowest sensitivity of luminosity/transmittivity, a second color and a third color may be either red or green, and a fourth color may be white. However, this is merely an illustrative example, and exemplary embodiments are not limited to these colors.

According to an exemplary embodiment, there is provided an organic light emitting display device capable of preventing color mixture defects.

According to an exemplary embodiment, there is provided a method of manufacturing an organic light emitting display device capable of preventing color mixture defects caused by bank defects or degradation of droplet directionality of an inkjet head.

According to an exemplary embodiment, there is provided a method of manufacturing an organic light emitting display device capable of simplifying processes of manufacturing a color filter.

According to an exemplary embodiment, there is provided a method of manufacturing an organic light emitting display device capable of reducing an amount of material used in manufacturing a color filter.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. An organic light emitting display device, comprising:
    a substrate;
    first electrodes disposed on the substrate;
    an organic light emitting layer formed on the first electrodes;
    a second electrode disposed on the organic light emitting layer;
    a color filter layer disposed on the second electrode,
    wherein the color filter layer comprises a first color filter, a plurality of second color filters, and a plurality of third color filters,
    wherein the first color filter, each of the second color filters, and each of the third color filters are configured to transmit a different wavelength of light,
    the first color filter is continuous in a plan view,
    each of the second color filters and each of the third color filters are disposed in one or more pixel blocks disposed in the first color filter, and
    the first color filter completely surrounds the one or more pixel blocks in a plan view,
    wherein the first color filter is configured to transmit a blue color of light,
    the second color filters and the third color filters do not overlap with the first color filter,
    each of the second color filters is directly surrounded by the first color filter,
    each of the third color filters is directly surrounded by the first color filter, and
    wherein the plurality of the second color filters are disposed in a series of rows and columns in plan view, and the third color filters are disposed in a row and column not occupied by the plurality of second color filters.

2. The organic light emitting display device of claim 1, wherein the second color filters are disposed in a first pixel block and the third color filters are disposed in a second pixel block disposed in a different area than the first pixel block.

3. The organic light emitting display device of claim 1, wherein the first color filter is a filter layer for color of light having a lower sensitivity of luminosity or transmittivity than colors of light transmitted through the second color filters and the third color filters.

4. The organic light emitting display device of claim 1, further comprising a protective layer interposed between the second electrode and the color filter layer.

5. The organic light emitting display device of claim 4, wherein the first color filter, the second color filters, and the third color filters are disposed directly on the protective layer.

6. The organic light emitting display device of claim 1, wherein the color filter layer further comprises a plurality of fourth color filters configured to transmit a white color, the fourth color filters being disposed in at least one pixel block.

7. The organic light emitting display device of claim 6, wherein:
    the second color filters are disposed in a first pixel block;
    the third color filters are disposed in a second pixel block;
    the fourth color filters are disposed in a third pixel block; and
    the first, second, and third pixel blocks are disposed in different areas from each other.

8. A method of manufacturing an organic light emitting display device, comprising:
    forming first electrodes on a first substrate;
    forming an organic light emitting layer on the first electrodes;
    forming a second electrode on the organic light emitting layer;
    forming a color filter layer on the second electrode,
    wherein forming the color filter layer comprises:
        forming a first color filter being continuous in a plan view and comprising openings completely surrounded by the first color filter;
        forming a plurality of second color filters and a plurality of third color filters in the openings,
        wherein the first color filter is configured to transmit a blue color of light, and
    wherein each of the second color filters and each of the third color filters do not overlap with the first color filter, each of the second color filters is directly surrounded by the first color filter, each of the third color filters is directly surrounded by the first color filter, and wherein the plurality of the second color filters are disposed in a series of rows and columns in plan view, and the third color filters are disposed in a row and column not occupied by the plurality of second color filters.

9. The method of claim 8, wherein forming the first color filter comprises forming the first color filter using a photolithography process.

10. The method of claim 8, wherein forming the second color filters and the third color filters comprises forming the second color filters and the third color filters using by an inkjet process.

11. The method of claim 8, wherein the second color filters and the third color filters are formed in different openings.

12. The method of claim 8, wherein the first color filter is a filter layer for a color of light that has a lower sensitivity of luminosity or transmittivity than colors of light transmitted through the second color filters and the third color filters.

13. The method of claim 8, further comprising forming a protective layer disposed on the second electrode.

14. The method of claim 8, wherein forming the color filter layer further comprises forming a plurality of fourth color filters in the openings.

15. The method of claim 14, wherein:

the second color filters are disposed in a first opening;

the third color filters are disposed in a second opening;

the fourth color filters are disposed in a third opening; and the first, second, and third openings are disposed in different areas from each other.

* * * * *